US008797073B2

(12) United States Patent
Park et al.

(10) Patent No.: US 8,797,073 B2
(45) Date of Patent: Aug. 5, 2014

(54) DELAY LOCKED LOOP CIRCUIT AND INTEGRATED CIRCUIT INCLUDING THE SAME

(75) Inventors: Min-Su Park, Gyeonggi-do (KR); Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 129 days.

(21) Appl. No.: 12/981,256

(22) Filed: Dec. 29, 2010

(65) Prior Publication Data

US 2012/0007645 A1 Jan. 12, 2012

(30) Foreign Application Priority Data

Jul. 6, 2010 (KR) ........................ 10-2010-0064901

(51) Int. Cl.
 *H03L 7/06* (2006.01)
(52) U.S. Cl.
 USPC ........... 327/158; 327/147; 327/149; 327/156; 327/161
(58) Field of Classification Search
 USPC ...................... 327/141, 144–163; 331/15–17; 375/373–376
 See application file for complete search history.

(56) References Cited

U.S. PATENT DOCUMENTS

| 6,141,163 | A  | * | 10/2000 | Nakamura et al. ............... 360/51 |
| 7,276,944 | B2 | * | 10/2007 | Miyazaki ....................... 327/156 |
| 7,710,171 | B2 | * | 5/2010  | Kim et al. ...................... 327/158 |
| 7,821,310 | B2 | * | 10/2010 | Yun et al. ...................... 327/158 |
| 7,940,096 | B2 | * | 5/2011  | Ku ................................ 327/158 |
| 2002/0003453 | A1 | * | 1/2002 | Segawa et al. ................... 331/14 |
| 2009/0256604 | A1 | * | 10/2009 | Ku ................................ 327/158 |

FOREIGN PATENT DOCUMENTS

| KR | 1020020019380 | 3/2002 |
| KR | 1020060046024 | 5/2006 |

OTHER PUBLICATIONS

Notice of Allowance issued by the Korean Intellectual Property Office on May 11, 2012.

* cited by examiner

*Primary Examiner* — Brandon S Cole
(74) *Attorney, Agent, or Firm* — IP & T Group LLP

(57) ABSTRACT

A delay locked loop (DLL) circuit includes a timing pulse generating unit configured to generate a plurality of timing pulses, which are sequentially pulsed during delay shifting update periods, in response to a source clock, wherein the number of the generated timing pulses changes according to a frequency of the source clock; a clock delay unit configured to compare a phase of the source clock with a phase of a feedback clock at a time point defined by each of the timing pulses, and delay a phase of an internal clock, corresponding to a rising or falling edge of the source clock, according to the comparison result; and a delay replica modeling unit configured to reflect actual delay conditions of the internal clock path on an output clock of the clock delay unit, and to output the feedback clock.

27 Claims, 9 Drawing Sheets

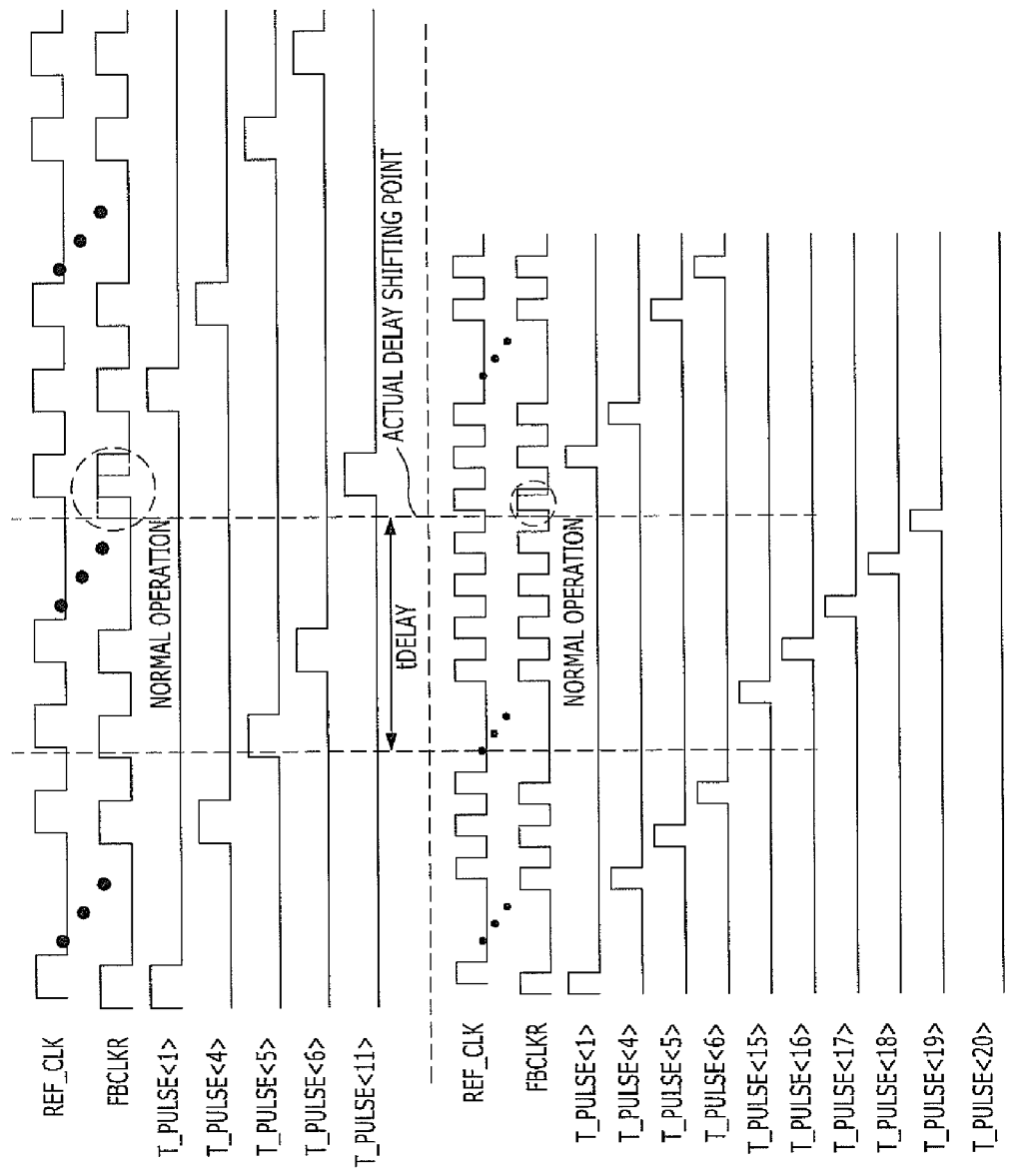

DELAY LOCKED LOOP CIRCUIT AND INTEGRATED CIRCUIT INCLUDING THE SAME

CROSS-REFERENCE TO RELATED APPLICATION

The present application claims priority of Korean Patent Application No. 10-2010-0064901, filed on Jul. 6, 2010, which is incorporated herein by reference in its entirety.

BACKGROUND OF THE INVENTION

Exemplary embodiments of the present invention relate to semiconductor design technology, and more particularly, to a delay locked loop (DLL) circuit, and an integrated circuit including the same.

A synchronous semiconductor memory device such as a DDR SDRAM (Double Data Rate Synchronous Dynamic Random Access Memory) communicates data to external devices by using an internal clock synchronized with an external clock inputted from an external device such as a memory controller (CTRL). The reason for this is that the time synchronization between the external clock applied from a memory controller to a memory and the data outputted from the memory is very important in order to stably transmit data between the memory and the external devices.

However, the internal clock which is applied to the memory in synchronization with the external clock may be asynchronous with the external clock because of a delay resulting from passing through each of the components of the memory. Thus, for stable transmission of the data outputted from the memory, the internal clock and the external clock are to be synchronized with each other by compensating for the load time of the data on a bus so that the internal clock delayed through each of the data transmitting components of the memory is activated accurately at the edge or center of a pulse of the external clock applied from the memory controller.

Examples of such clock synchronization circuits are a phase locked loop (PLL) circuit and a delay locked loop (DLL) circuit.

When the frequency of the external clock and the frequency of the internal clock are different from each other, a phase locked loop (PLL) is mainly used to adjust the frequency. However, when the frequency of the external clock and the frequency of the internal clock are identical to each other, a delay locked loop (DLL) circuit is mainly used because it is less affected by a noise and can be implemented in a smaller area than a phase locked loop (PLL).

FIG. 1 is a block diagram illustrating a conventional delay locked loop (DLL) circuit.

Referring to FIG. 1, the conventional delay locked loop (DLL) circuit includes a phase comparing unit 100R/100F, a timing pulse generating unit 110, a mode control unit 120R/120F, a delay shift control unit 130R/130F, a phase delay unit 140R/140F, a delay replica modeling unit 150R/150F, a pre duty cycle correcting unit 160A, a duty cycle correcting unit 150B, a DLL circuit driver 170, a power-down mode control unit 180A, a clock buffer unit 180B and a DLL control unit 190.

The phase comparing unit 100R/100F is configured to compare the phase of a source clock REFCLK with the phase of a feedback clock FBCLKR/FBCLKF. The timing pulse generating unit 110 is configured to generate a plurality of timing pulses T_PULSE<0:12> activated sequentially for delay shifting update periods in response to a control clock CONTCLK synchronized with the source clock REFCLK.

The mode control unit 120R/120F is configured to generate mode control signals FM_END, LOCK_STATE, FM_END_F, and LOCK_STATEF corresponding to the comparison results FINE, COARSE, FM_PDOUT, FINEF, COARSEF, and FM_PDOUTF of the phase comparing unit 100R/100F in response to the second timing pulse T_PULSE<2> or the eighth timing pulse T_PULSE<8> among the timing pulses T_PULSE<0:12>.

The delay shift control unit 130R/130F is configured to generate first delay shift control signals FRCLK_SL, FRCLK_SR, SRCLK_SL, SRCLK_SR, FFCLK_SL, FFCLK_SR, SFCLK_SL, and SFCLK_SR for controlling a delay shifting operation in a normal mode and a coarse mode and second delay shift control signals FASTR_SL and FASTF_SL for controlling a delay shifting operation in a fast mode in response to the mode control signals FM_END, LOCK_STATE, FM_END_F and LOCK_STATEF, and the third timing pulse T_PULSE<3>, the sixth timing pulse T_PULSE<6>, the ninth timing pulse T_PULSE<9>, the tenth timing pulse T_PULSE<10>, or the twelfth timing pulse T_PULSE<12> among the timing pulses T_PULSE<0:12>.

The phase delay unit 140R/140F is configured to delay-shift the phase of an internal clock CLKIN1/CLKIN2 synchronized with the source clock REFCLK and the control clock CONTCLK on a delay unit basis in response to the first delay shift control signals FRCLK_SL, FRCLK_SR, SRCLK_SL, SRCLK_SR, FFCLK_SL, FRCLK_SR, SFCLK_SL, and SFCLK_SR in the normal mode, delay-shift the phase of the internal clock CLKIN1/CLKIN2 on a unit basis (the unit is smaller than the delay unit) in response to the first delay shift control signals FRCLK_SL, FRCLK_SR, SRCLK_SL, SRCLK_SR, FFCLK_SL, FFCLK_SR, SFCLK_SL, and SFCLK_SR in the coarse mode, and delay-shift the phase of the internal clock CLKIN1 and CLKIN2 on a delay group basis (the delay group includes a plurality of delay units) in response to the second delay shift control signals FASTR_SL and FASTF_SL in the fast mode.

The delay replica modeling unit 150R/150F is configured to delay output clocks IFBCLKR and IFBCLKF of a duty cycle correcting unit 160B using a delay time corresponding to the actual delay conditions of an internal clock path and output the feedback clocks FBCLKR and FBCLKF.

The clock buffer unit 180B is configured to buffer an external clock CLK and generate the source clock REFCLK, control clock CONTCLK, and internal clocks CLKIN1 and CLKIN2, the phases of which are synchronized. The power-down mode control unit 180A is configured to control an operation of the clock buffer unit 1808 in response to an inversion signal CKEB_COM of a clock enable signal, a signal SAPB with power-down mode information of a mode register set MRS, and a signal RASIDLE with precharge information.

The DLL control unit 190 is configured to generate a reset signal RESET for controlling an operation of the DLL circuit in response to a DLL disable signal DIS_DLL and a DLL reset signal DLL_RESETB inputted from an external device of an integrated circuit.

The pre duty cycle correcting unit 160A is configured to invert the phase of the output clocks MIXOUT_R and MIXOUT_F (mainly MIXOUT_F) of the phase delay unit 140R/140F and output a rising internal clock RISING_CLK with a rising edge corresponding to the rising edge of the internal clocks CLKIN1 and CLKIN2 and a falling internal clock FALLING_CLK with a rising edge corresponding to the falling edge of the internal clocks CLKIN1 and CLKIN2. The duty cycle correcting unit 160B configured to correct the duty cycle ratio of the output clocks RISING_CLK and FALLING_CLK of the pre duty cycle correcting unit 160A in a locking state.

The DLL circuit driver 170 is configured to output DLL output clocks IRCLKDLL and IFCLKDLL, generated by driving the output clocks IFBCLKR and IFBCLKF of the duty cycle correcting unit 160B, to an output driver of the integrated circuit.

FIG. 2 is a block diagram illustrating the timing pulse generating unit of the conventional DLL circuit illustrated in FIG. 1.

For reference, the fact that the last pulse among the timing pulses T_PULSE<0:12> generated by the timing pulse generating unit 110 of the DLL circuit is the twelfth timing pulse means that the delay shifting update period of the DLL circuit illustrated in FIG. 1 is defined by the twelfth time that the external clock CLK toggles. In other words, the duration of the delay shifting update period depends on the time it takes for the external clock to toggle and the number of pulses generated by the timing pulse generating unit 110. For example, where the external clock toggles 12 times in a period of 12 tCK and the timing pulse generating unit 110 generates 12 timing pulses T_PULSE<0:12>, the delay shifting update period is 12 tCK. While here the timing pulse generating unit 110 generates 12 pulses, it should be understood that more or fewer pulses may be generated in which case the delay shifting update period changes.

Referring to FIG. 2, the timing pulse generating unit 110 includes: a timing pulse outputting unit 112 configured to output the timing pulses T_PULSE<1:12> activated/pulsed sequentially in response to the toggling of the control clock CONTCLK synchronized with the source clock REFCLK; and an operation control unit 114 configured to repeat the operation of the timing pulse outputting unit 112.

Here, the timing pulse outputting unit 112 sequentially activates/pulses the timing pulses T_PULSE<1:12> whenever the control clock CONTCLK toggles after the activation/pulsing of the reference timing pulse T_PULSE<0> among the timing pulses T_PULSE<0:12>. Further, the timing pulse outputting unit 112 outputs the timing pulses T_PULSE<0:12> to the operation control unit 114.

The operation control unit 114 activates/pulses the reference timing pulse T_PULSE<0> in response to the deactivation of all the timing pulses T_PULSE<0:12>.

FIG. 3 is a timing diagram illustrating the operations of the conventional timing pulse generating unit illustrated in FIG. 2.

Referring to FIG. 3, the timing pulse generating unit 110 sequentially activates/pulses the other timing pulses T_PULSE<2:12> from the first timing pulse T_PULSE<1>, which is a high active signal, in response to the toggling of the control clock CONTCLK synchronized with the source clock REFCLK after the reference timing pulse T_PULSE<0>, which is a low active signal among the timing pulses T_PULSE<0:12>, is being activated to a logic 'low' level. Here, the reference timing pulse T_PULSE<0> is deactivated to a logic 'high' level in response to the activation/pulsing of the first timing pulse T_PULSE<1> to a logic 'high' level.

The phase comparing unit 100R/100F performs its operation at the time point corresponding to the second timing pulse T_PULSE<2> or the eighth timing pulse T_PULSE<8>, and the mode control unit 120R/120F generates the mode control signals FM_END, LOCK_STATE, FM_END_F, and LOCK_STATEF corresponding to the comparison results FINE, COARSE, FM_PDOUT, FINEF, COARSEF, and FM_PDOUTF. Also, the delay shifting operation is performed in the normal mode and the coarse mode in response to the mode control signals FM_END, LOCK_STATE, FM_END_F, and LOCK_STATEF at the time point corresponding to the third timing pulse T_PULSE<3>, the sixth timing pulse T_PULSE<6>, the ninth timing pulse T_PULSE<9>, the tenth timing pulse T_PULSE<10>, or the twelfth timing pulse T_PULSE<12>.

In this manner, the time points of all the operations of the DLL circuit are defined by the timing pulses T_PULSE<0:12> generated by the timing pulse generating unit 110, which may be predetermined by the designer. For example, as described above, the operation of the phase comparing unit 100R/100F is performed at the time point corresponding to the second timing pulse T_PULSE<2> or the eighth timing pulse T_PULSE<8>, and the delay shifting operation is performed at the time point corresponding to the third timing pulse T_PULSE<3>, the sixth timing pulse T_PULSE<6>, the ninth timing pulse T_PULSE<9>, the tenth timing pulse T_PULSE<10>, or the twelfth timing pulse T_PULSE<12>, which are merely values predetermined by the designer and may vary according to the types of integrated circuits. However, once the DLL operation in the integrated circuit is defined by the timing pulses T_PULSE<0:12>, it is difficult to change its timing.

Thus, as described below, the DLL circuit may malfunction when there is a significant change in the frequency of the source clock REFCLK inputted to the integrated circuit.

FIG. 4 is a timing diagram illustrating the malfunction of the conventional timing pulse generating unit illustrated in FIG. 2.

Referring to FIG. 4, it can be seen that the operations of the timing pulse generating unit 110 are divided into a low frequency operation in which the source clock REFCLK has a relatively low frequency and a high frequency operation in which the source clock REFCLK has a relatively high frequency.

The DLL operation is simplified for convenience in description. That is, it is assumed that the operation of comparing the phase of the source clock FEFCLK with the phase of the feedback clocks FBCLKR and FBCLKF is performed in response to the fourth to sixth timing pulses T_PULSE<4:6> of the timing pulses T_PULSE<0:12>, and that the delay shifting operation, which changes the phase of the feedback clocks FBCLKR and FBCLKF, is performed after the predetermined time tDELAY corresponding to the actual delay of the internal clock path from the phase comparing operation.

Regarding the operation of the timing pulse generating unit 110 in the case of the source clock REFCLK with a relatively low frequency, because the source clock REFCLK has a low frequency, the delay shifting operation may be performed, after the operation of comparing the phase of the source clock FEFCLK with the phase of the feedback clocks FBCLKR and FBCLKF is performed at around the fourth to sixth timing pulses T_PULSE<4:6> of the timing pulses T_PULSE<0:12>, to change the phase of the feedback clocks FBCLKR and FBCLKF before all of the timing pulses T_PULSE<0:12> are activated/pulsed once.

That is, because the source clock REFCLK has a low frequency, the time taken until completion of the delay shifting operation of the DLL circuit is shorter than the time 12 tck taken to pulse/activate all the timing pulses T_PULSE<0:12> once sequentially. Thus, the DLL operation may repeat without any malfunction.

Regarding the operation of the timing pulse generating unit 110 in the case of the source clock REFCLK with a relatively high frequency, because the source clock REFCLK has a high frequency, the phase of the feedback clocks FBCLKR and FBCLKF changes when all the timing pulses T_PULSE<0:

12> are sequentially activated/pulsed once and the second pulsing thereof starts, even though the delay shifting operation is performed after the operation of comparing the phase of the source clock FEFCLK with the phase of the feedback clocks FBCLKR and FBCLKF is performed at around the fourth to sixth timing pulses T_PULSE<4:6> of the timing pulses T_PULSE<0:12>.

That is, because the source clock REFCLK has a high frequency, the time taken until completion of the delay shifting operation of the DLL circuit is longer than the time 12 tck taken to activate/pulse all the timing pulses T_PULSE<0:12> once sequentially. Thus, the DLL may malfunction.

The reason for the above malfunction is that the predetermined time tDELAY, corresponding to the actual delay of the internal clock path applied essentially when the feedback clocks FBCLKR and FBCLKF are generated from the source clock REFCLK in the operation of the DLL circuit, is not changed in synchronization with the frequency of the source clock REFCLK.

Thus, when generating the timing pulses T_PULSE<0:12> for controlling the operation of the conventional DLL circuit, the applicable frequency of the source clock REFCLK may be limited. Also, when the applicable frequency bandwidth of the source clock REFCLK is too wide, the time taken to perform the DLL operation of the DLL circuit may increase significantly.

SUMMARY OF THE INVENTION

Exemplary embodiments of the present invention are directed to a delay locked loop (DLL) circuit that can perform an optimal DLL operation regardless of a change in the frequency of a source clock.

In accordance with an exemplary embodiment of the present invention, a delay locked loop (DLL) circuit includes: a timing pulse generating unit configured to generate a plurality of timing pulses, which are sequentially pulsed during delay shifting update periods, in response to a source clock, wherein the number of the generated timing pulses changes according to a frequency of the source clock; a clock delay unit configured to compare a phase of the source clock with a phase of a feedback clock at a time point defined by each of the timing pulses, and delay a phase of an internal clock, corresponding to a rising or falling edge of the source clock, according to the comparison result; and a delay replica modeling unit configured to reflect actual delay conditions of the internal clock path on an output clock of the clock delay unit, and to output the feedback clock.

In accordance with another exemplary embodiment of the present invention, an integrated circuit includes: a DLL circuit configured to output a DLL clock by delaying an internal clock, corresponding to an edge of a source clock, for delay shifting update periods defined by a plurality of timing pulses pulsed sequentially in response to the source clock, in order to lock a delay of the internal clock; and a timing pulse generating unit configured to generate the timing pulses pulsed sequentially for the delay shifting update periods in response to the source clock, wherein the number of the generated timing pulses changes according to a frequency of the source clock.

In accordance with yet another exemplary embodiment of the present invention, an integrated circuit includes a clock frequency detecting unit configured to detect a frequency of a source clock; and a timing pulse generating unit configured to generate a plurality of timing pulses sequentially pulsed in response to the source clock, wherein the number of the generated timing pulses changes according to the detected result.

BRIEF DESCRIPTION OF THE DRAWINGS

FIG. 7 is a timing diagram illustrating the operation of the timing pulse generating unit in accordance with the first to third exemplary embodiments of the present invention illustrated in FIGS. 6A to 6C.

DESCRIPTION OF SPECIFIC EMBODIMENTS

Figure 1:
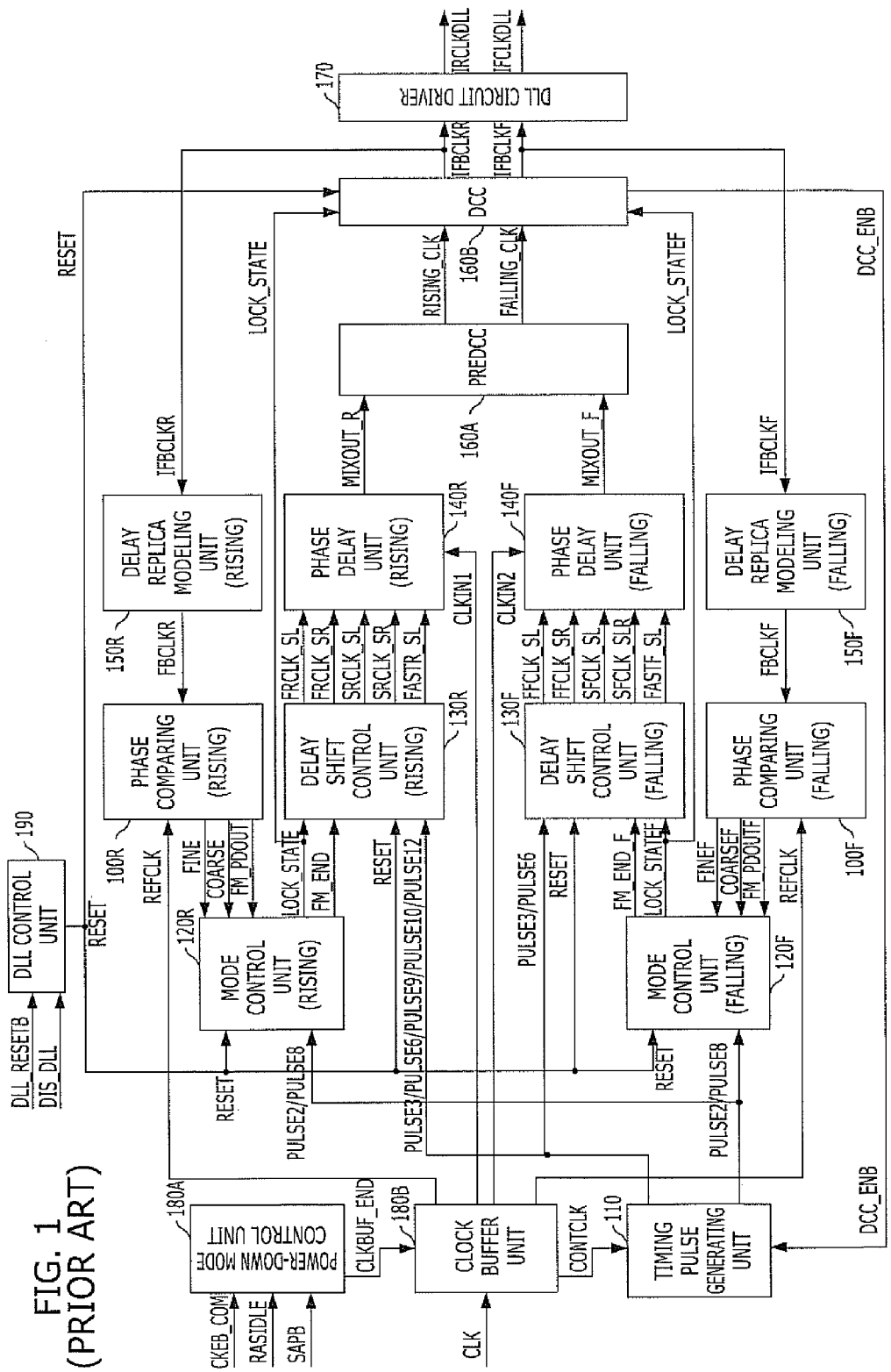
FIG. 1 is a block diagram illustrating a conventional delay locked loop (DLL) circuit.
Figure 2:
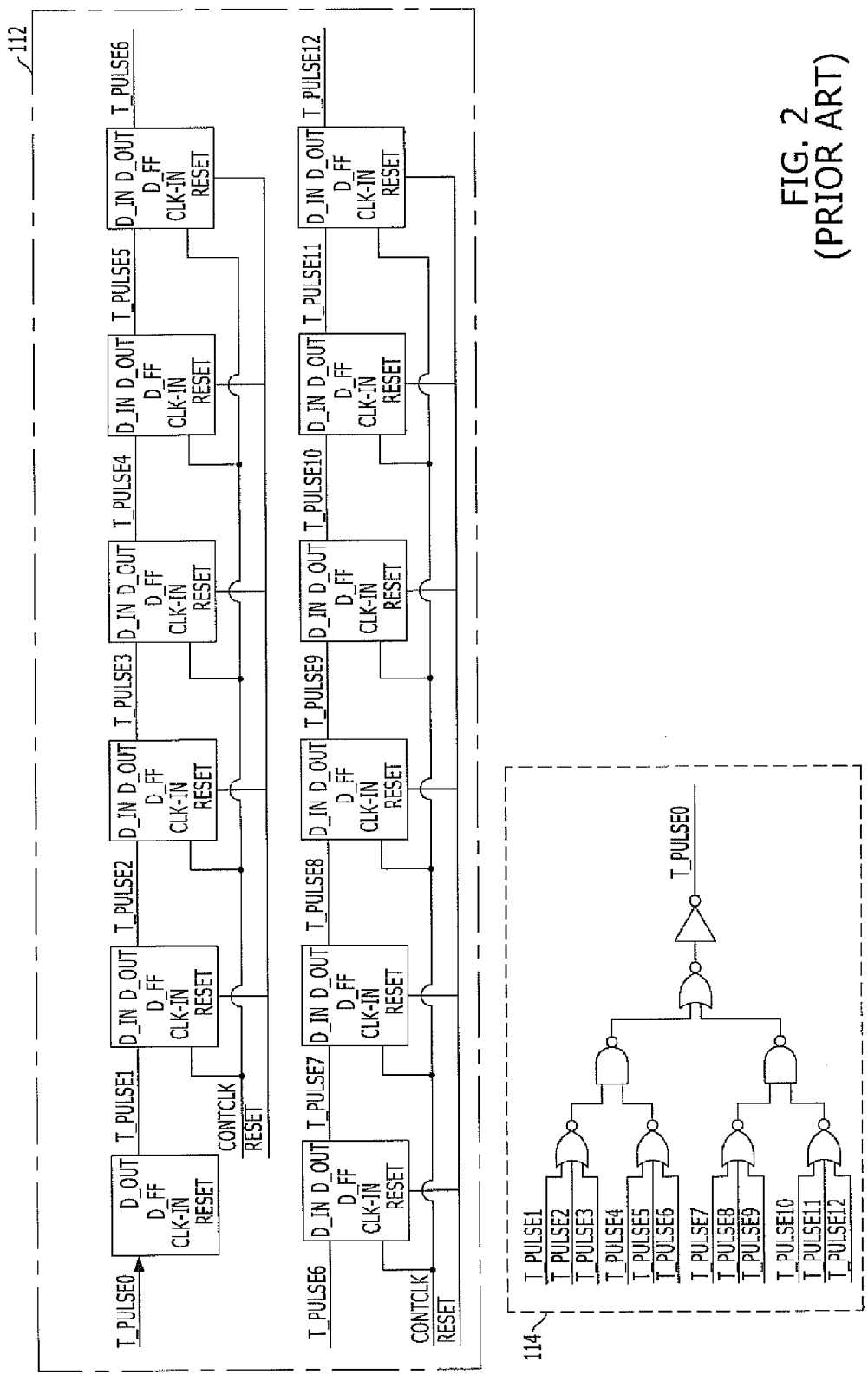
FIG. 2 is a block diagram illustrating a timing pulse generating unit of the conventional DLL circuit illustrated in FIG. 1.
Figure 3:
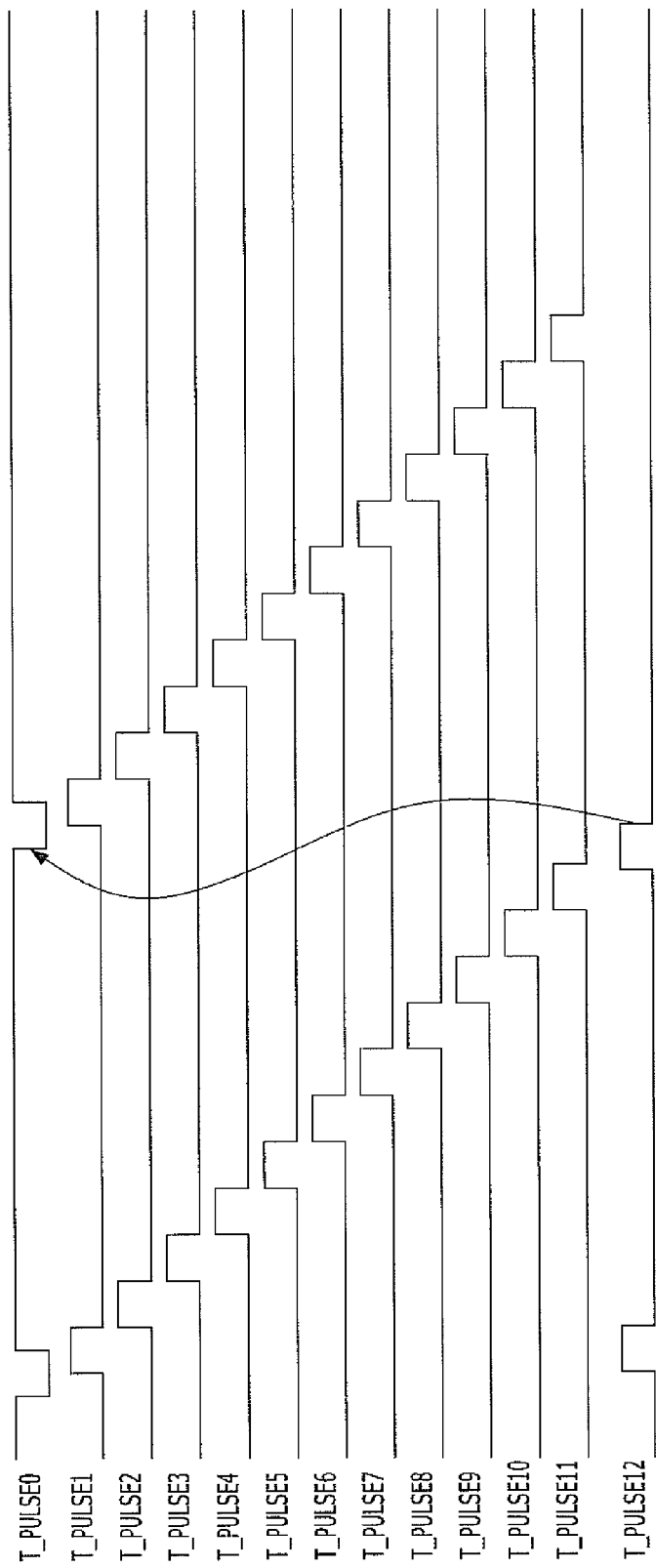
FIG. 3 is a timing diagram illustrating the operations of the conventional timing pulse generating unit illustrated in FIG. 2.
Figure 4:
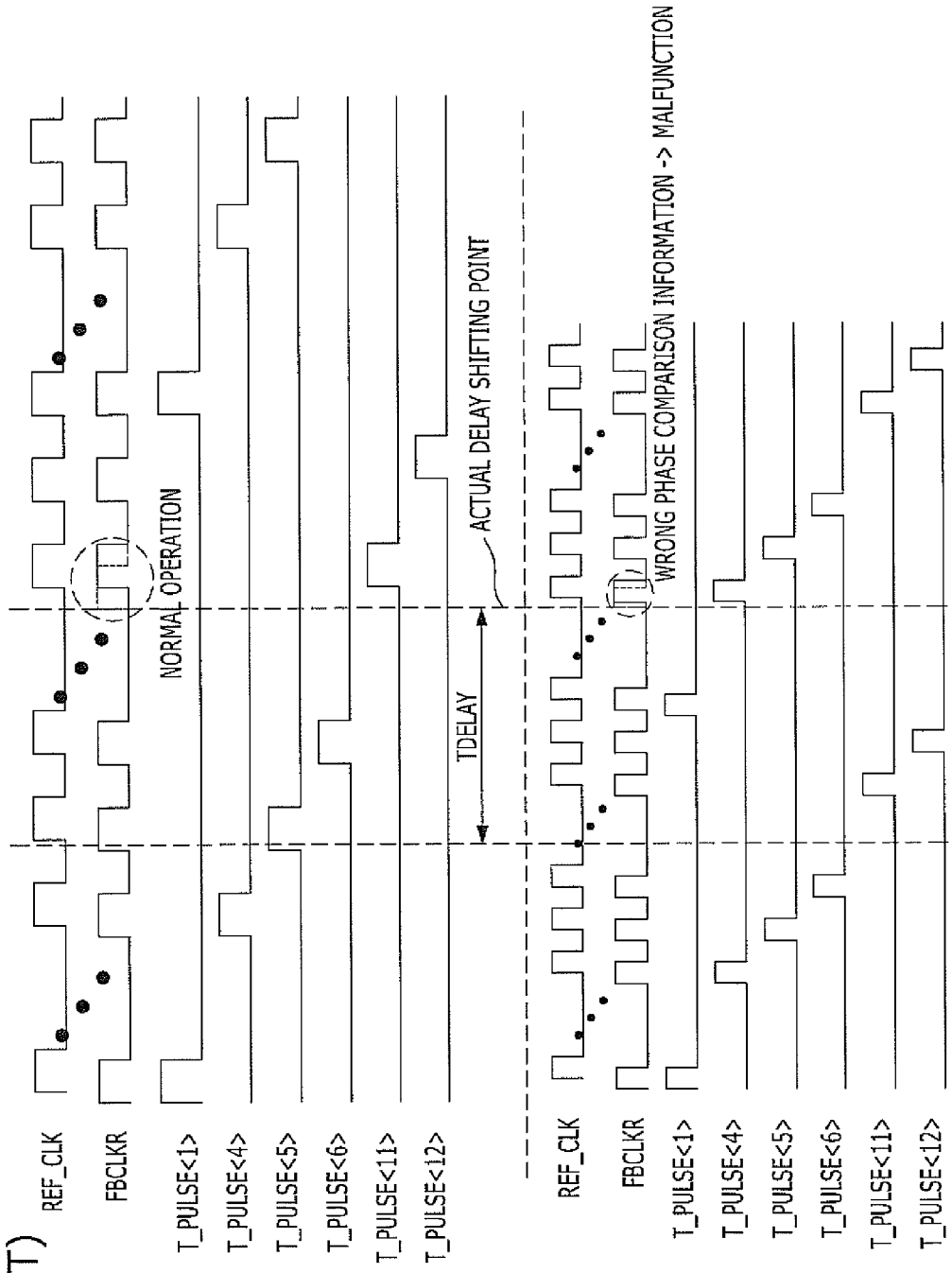
FIG. 4 is a timing diagram illustrating the malfunction of the conventional timing pulse generating unit illustrated in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
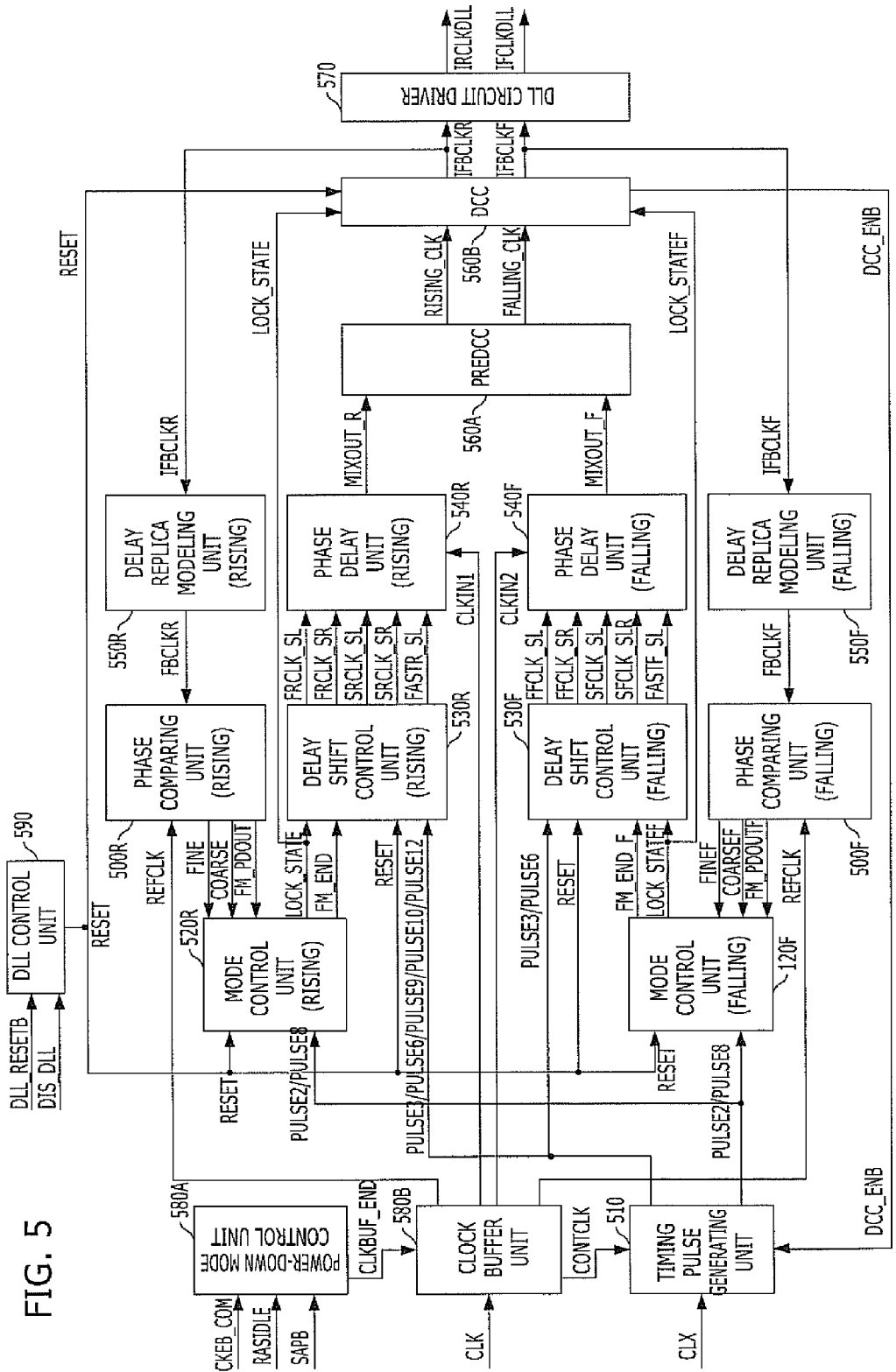
FIG. 5 is a block diagram illustrating a DLL circuit in accordance with an exemplary embodiment of the present invention.

FIG. 5 is a block diagram illustrating a DLL circuit in accordance with an exemplary embodiment of the present invention.

Referring to FIG. 5, a DLL circuit in accordance with an exemplary embodiment of the present invention includes a phase comparing unit 500R/500F, a timing pulse generating unit 510, a mode control unit 520R/F, a delay shift control unit 530R/530F, a phase delay unit 540R/540F, a delay replica modeling unit 550R/550F, a pre duty cycle correcting unit 560A, the duty cycle correcting unit 560B, a DLL circuit driver 570, a power-down mode control unit 580A, a clock buffer unit 580B and a DLL control unit 590.

The phase comparing unit 500R/500F is configured to compare the phase of a source clock REFCLK with the phase of feedback clocks FBCLKR and FBCLKF. The timing pulse generating unit 510 is configured to generate a plurality of timing pulses T_PULSE<1:N> activated sequentially for delay shifting update periods in response to a control clock CONTCLK synchronized with the source clock REFCLK. The number of the generated timing pulses changes according to the frequency of the source clock REFCLK.

The mode control unit 520R/520F is configured to generate mode control signals FM_END, LOCK_STATE, FM_END_F and LOCK_STATEF corresponding to the comparison results FINE, COARSE, FM_PDOUT, FINEF, COARSEF, and FM_PDOUTF of the phase comparing unit 500R/500F in response to the second timing pulse T_PULSE<2> or the eighth timing pulse T_PULSE<8> among the timing pulses T_PULSE<1:N>.

The delay shift control unit 530R/530F is configured to generate first delay shift control signals FRCLK_SL, FRCLK_SR, SRCLK_SL, SRCLK_SR, FFCLK_SL, FFCLK_SR, SFCLK_SL, and SFCLK_SR for controlling a delay shifting operation in a normal mode and a coarse mode and second delay shift control signals FASTR_SL and FASTF_SL for controlling a delay shifting operation in a fast mode in response to the mode control signals FM_END, LOCK_STATE, FM_END_F and LOCK_STATEF, and the third timing pulse T_PULSE<3>, the sixth timing pulse T_PULSE<6>, the ninth timing pulse T_PULSE<9>, the tenth timing pulse T_PULSE<10>, or the twelfth timing pulse T_PULSE<12> among the timing pulses T_PULSE<1:N>.

The phase delay unit 540R/540F is configured to delay-shift the phases of internal clocks CLKIN1 and CLKIN2 synchronized with the source clock REFCLK and the control clock CONTCLK on a delay unit basis in response to the first delay shift control signals FRCLK_SL, FRCLK_SR, SRCLK_SL, SRCLK_SR, FFCLK_SL, FFCLK_SR, SFCLK_SL, and SFCLK_SR in the normal mode, delay-shift the phases of the internal clocks CLKIN1 and CLKIN2 on a unit basis (the unit is smaller than the delay unit) in response to the first delay shift control signals FRCLK_SL, FRCLK_SR, SRCLK_SL, SRCLK_SR, FFCLK_SL, FFCLK_SR, SFCLK_SL, and SFCLK_SR in the coarse mode, and delay-shift the phases of the internal clocks CLKIN1 and CLKIN2 on a delay group basis (the delay group includes a plurality of delay units) in response to the second delay shift control signals FASTR_SL and FASTF_SL in the fast mode.

The delay replica modeling unit 550R/550F is configured to delay output clocks IFBCLKR and IFBCLKF of the duty cycle correcting unit 560B using a delay time obtained by modeling the actual delay of an internal clock path, and to output the feedback clocks FBCLKR and FBCLKF.

The clock buffer unit 580B is configured to buffer an external clock CLK and generate the source clock REFCLK, control clock CONTCLK, and internal clocks CLKIN1 and CLKIN2, having synchronized phases. The power-down mode control unit 580A is configured to control an operation of the clock buffer unit 580B in response to an inversion signal CKEB_COM of a clock enable signal, a signal SAPB with power-down mode information of a mode register set MRS, and a signal RASIDLE with precharge information.

The DLL control unit 590 is configured to generate a reset signal RESET for controlling an operation of the DLL circuit in response to a DLL disable signal DIS_DLL and a DLL reset signal DLL_RESETB inputted from an external device of an integrated circuit.

The pre duty cycle correcting unit 560A is configured to invert the phase of the output clocks MIXOUT_R and MIXOUT_F (mainly MIXOUT_F) of the phase delay unit 540R/540F and output a rising internal clock RISING_CLK with a rising edge corresponding to the rising edge of the internal clocks CLKIN1 and CLKIN2 and a falling internal clock FALLING_CLK with a rising edge corresponding to the falling edge of the internal clocks CLKIN1 and CLKIN2. The duty cycle correcting unit 560B is configured to correct the duty cycle ratio of the output clocks RISING_CLK and FALLING_CLK of the pre duty cycle correcting unit 560A in a locking state.

The DLL circuit driver 570 is configured to output DLL output clocks IRCLKDLL and IFCLKDLL, generated by driving the output clocks IFBCLKR and IFBCLKF of the duty cycle correcting unit 560B, to an output driver of the integrated circuit.

Here, the fact that the last pulse among the timing pulses T_PULSE<1:N> generated by the timing pulse generating unit 510 is the $N^{th}$ timing pulse means that the delay shifting update period of the DLL circuit is defined by the Nth time that the external clock CLK toggles. In other words, the duration of the delay shifting update period depends on the time it takes for the external clock to toggle and the number of pulses generated by the timing pulse generating unit 510. For example, where the external clock toggles N times in a period of N tCK and the timing pulse generating unit 110 generates N timing pulses T_PULSE<0:N>, the delay shifting update period is N tCK. Here, 'N' is not a predefined value but varies according to the frequency of the source clock REFCLK.

Further, the timing pulse generating unit 510 increases the number of timing pulses T_PULSE<1:N> according to an increase in the frequency of the source clock REFCLK and decreases the number of timing pulses T_PULSE<1:N> according to a decrease in the frequency of the source clock REFCLK.

Here, whether the frequency of the source clock REFCLK is high or low may be determined in various ways.

As illustrated in FIG. 5, when a CAS (Column Latency Strobe) Latency (CL) value is large, the frequency of the source clock REFCLK may be determined to be high; and when the CAS Latency (CL) value is small, the frequency of the source clock REFCLK may be determined to be low. That is, as the CL value increases, the 'N' value increases and thus the number of timing pulses T_PULSE<1:N> increases; and as the CL value decreases, the 'N' value decreases and thus the number of timing pulses T_PULSE<1:N> decreases.

Although not illustrated in FIG. 5, a clock frequency detecting unit for detecting the frequency of the source clock REFCLK may be further included to determine whether the frequency of the source clock REFCLK is high or low.

Likewise, although not illustrated in FIG. 5, information about the frequency of the source clock REFCLK may be received directly from an external device to determine whether the frequency of the source clock REFCLK is high or low. Here, the information about the frequency of the source clock REFCLK may be replaced with a test signal.

Figure 6A:
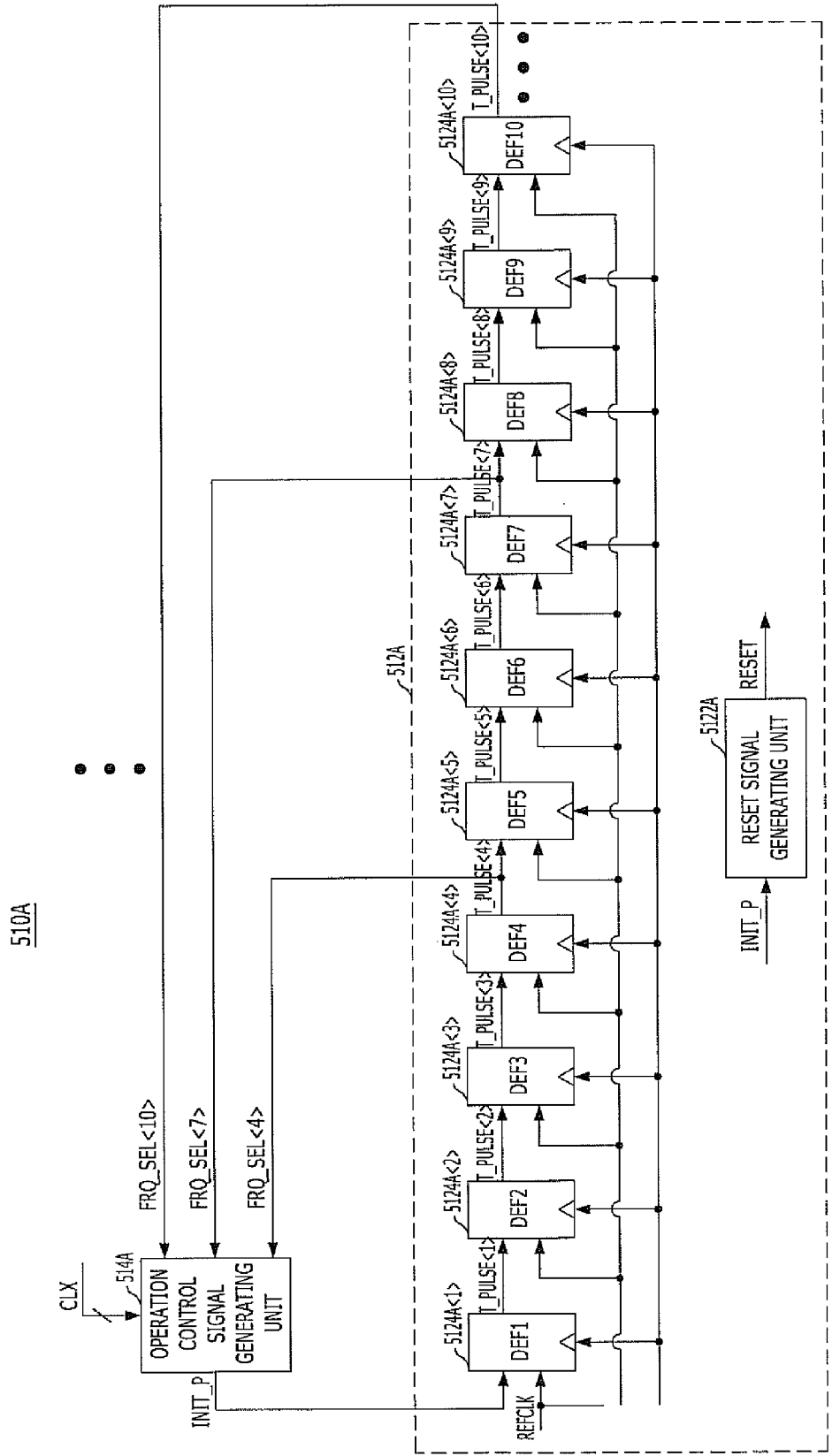
FIG. 6A is a block diagram illustrating a first exemplary embodiment of a timing pulse generating unit of the DLL circuit in accordance with the exemplary embodiment of the present invention illustrated in FIG. 5.

FIG. 6A is a block diagram illustrating a first exemplary embodiment of the timing pulse generating unit of the DLL circuit in accordance with the exemplary embodiment of the present invention illustrated in FIG. 5.

Referring to FIG. 6A, a timing pulse generating unit 510A in accordance with a first exemplary embodiment of the present invention includes: a timing pulse outputting unit 512A configured to initialize an operation thereof in response to an operation control signal INIT_P and output the timing pulses T_PULSE<1:N> activated/pulsed sequentially in response to the toggling of the source clock REFCLK, wherein at least two pulses (e.g., T_PULSE<4>, T_PULSE<7>, T_PULSE<10>, . . . ) among the timing pulses T_PULSE<1:N> are set as frequency selection pulses (e.g., FRQ_SEL<4>, FRQ_SEL<7>, FRQ_SEL<10>, . . . );

and an operation control signal generating unit 514A configured to select any one of the frequency selection pulses (e.g., FRQ_SEL<4>, FRQ_SEL<7>, FRQ_SEL<10>, . . . ) in response to the frequency of the source clock REFCLK and generate the operation control signal INIT_P in response to the selected pulse.

Here, the timing pulse outputting unit 512A includes: a reset signal generating unit 5122A configured to generate a reset signal RESET in response to the operation control signal INIT_P; and a plurality of timing pulse control units 5124A<1:N> configured to initialize an operation thereof in response to the reset signal RESET and activate/pulse the timing pulses T_PULSE<1:N> sequentially in response to the operation control signal INIT_P and the source clock REFCLK after the operation initialization.

When the frequency of the source clock REFCLK is high, the operation control signal generating unit 514A selects a pulse activated/pulsed later among the frequency selection pulses (FRQ_SEL<4>, FRQ_SEL<7>, FRQ_SEL <10>, . . . ); and when the frequency of the source clock REFCLK is low, the operation control signal generating unit 514a selects a pulse activated/pulsed earlier among the frequency selection pulses (FRQ_SEL<4>, FRQ_SEL<7>, FRQ_SEL<10>, . . . ). The operation control signal INIT_P is activated for a predetermined time in response to the selected pulse.

For example, when a CAS Latency (CLx) value is relatively large (i.e., 'x' is relatively large), the operation control signal generating unit 514A selects a pulse activated/pulsed relatively later among the frequency selection pulses (FRQ_SEL<4>, FRQ_SEL<7>, FRQ_SEL<10>, . . . ); and when the CAS Latency (CLx) value is relatively small (i.e., 'x' is relatively small), the operation control signal generating unit 514A selects a pulse activated/pulsed relatively earlier among the frequency selection pulses (FRQ_SEL<4>, FRQ_SEL<7>, FRQ_SEL<10>, . . . ). The operation control signal INIT_P is activated for a predetermined time in response to the selected pulse.

Here, it is desired that the activation period of the operation control signal INIT_P is longer than the activation period of the reset signal RESET. That is, after the timing pulse control units 5124A<1:N> are initialized by the activation of the reset signal RESET, the operation control signal INIT_P maintains the activation state until starting to activate/pulse the first timing pulse T_PULSE<1> that is to be activated/pulsed first among the timing pulses T_PULSE<1:N>.

Figure 6B:
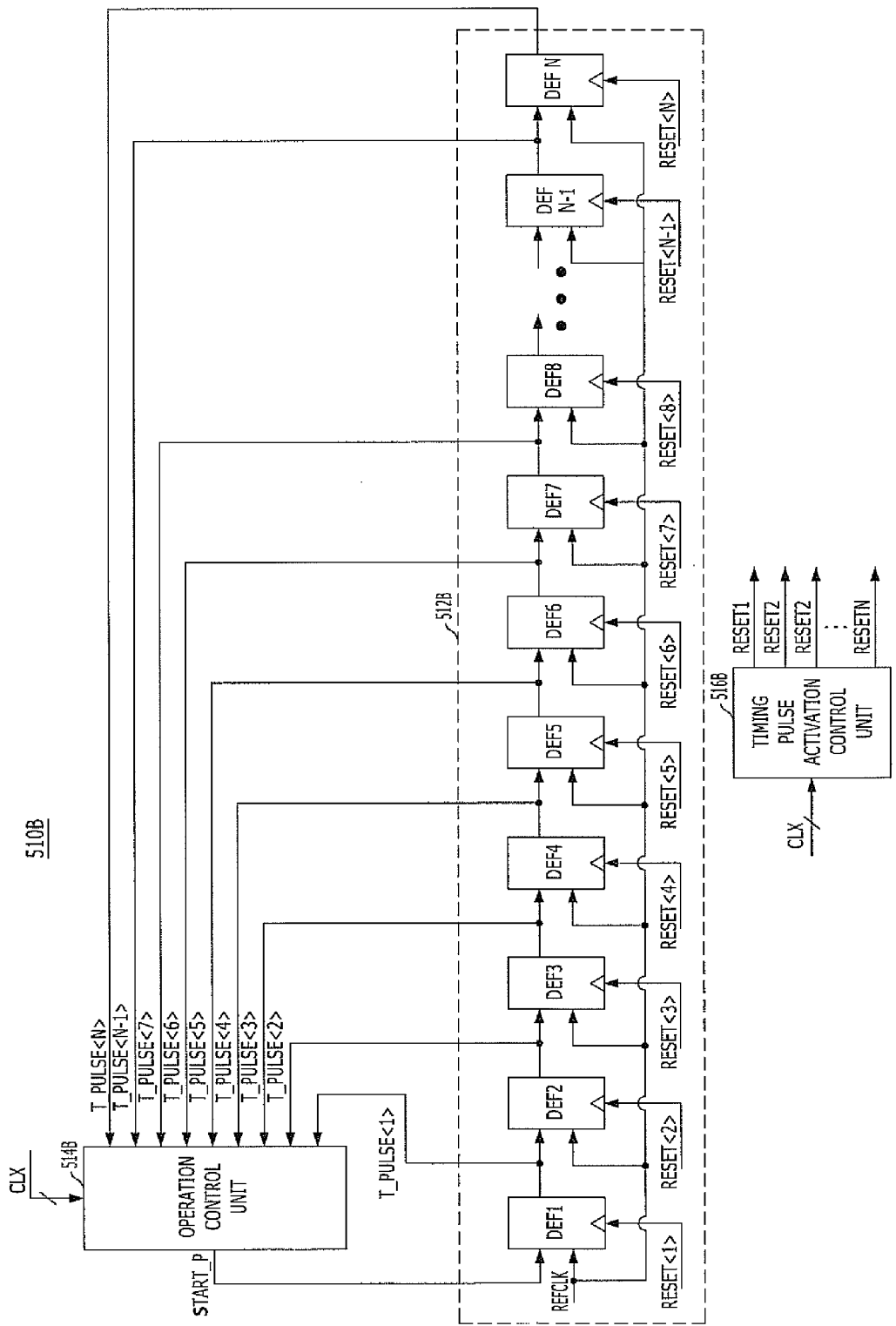
FIG. 6B is a block diagram illustrating a second exemplary embodiment of the timing pulse generating unit of the DLL circuit in accordance with the exemplary embodiment of the present invention illustrated in FIG. 5.

FIG. 6B is a block diagram illustrating a second exemplary embodiment of the timing pulse generating unit of the DLL circuit in accordance with the exemplary embodiment of the present invention illustrated in FIG. 5.

Referring to FIG. 6B, a timing pulse generating unit 510B in accordance with a second exemplary embodiment of the present invention includes: a timing pulse outputting unit 512B configured to output the timing pulses T_PULSE<1:N> activated/pulsed sequentially in response to the toggling of the source clock REFCLK; an operation control unit 514B configured to repeat the operation of the timing pulse outputting unit 512B; and a timing pulse activation control unit 516B configured to deactivate at least one timing pulse among the timing pulses T_PULSE<1:N> according to the frequency of the source clock REFCLK.

Here, the timing pulse outputting unit 512B activates/pulses the timing pulses T_PULSE<1:N> sequentially whenever the source clock REFCLK toggles after the toggling of a timing start pulse START_P.

The operation control unit 514B makes the timing start pulse START_P toggle in response to the deactivation of all the timing pulses T_PULSE<1:N>.

The timing pulse activation control unit 516B deactivates the timing pulses sequentially from the last pulse among the timing pulses T_PULSE<1:N> (i.e., T_PULSE<N>→T_PULSE<N-1>→ . . . →T_PULSE<2>→ T_PULSE<1>).

That is, when the frequency of the source clock REFCLK is high, the timing pulse activation control unit 516B reduces the number of deactivated pulses among the timing pulses T_PULSE<1:N>; and when the frequency of the source clock REFCLK is low, the timing pulse activation control unit 516B increases the number of deactivated pulses among the timing pulses T_PULSE<1:N>.

For example, when a CAS Latency (CLx) value is relatively large (i.e., 'x' is relatively large), the timing pulse activation control unit 516B deactivates a relatively low number of pulses among the timing pulses T_PULSE<1:N>; and when the CAS Latency (CLx) value is relatively small (i.e., 'x' is relatively small), the timing pulse activation control unit 516B deactivates a relatively high number of pulses among the timing pulses T_PULSE<1:N>.

Here, the timing pulse activation control unit 5168 may selectively activate a plurality of reset signals RESET<1: N>according to the frequency of the source clock REFCLK, so that the timing pulses T_PULSE<1:N>, corresponding respectively to the reset signals RESET<1:N>, may be deactivated or may be activated/pulsed in response to the toggling of the source clock REFCLK.

Figure 6C:
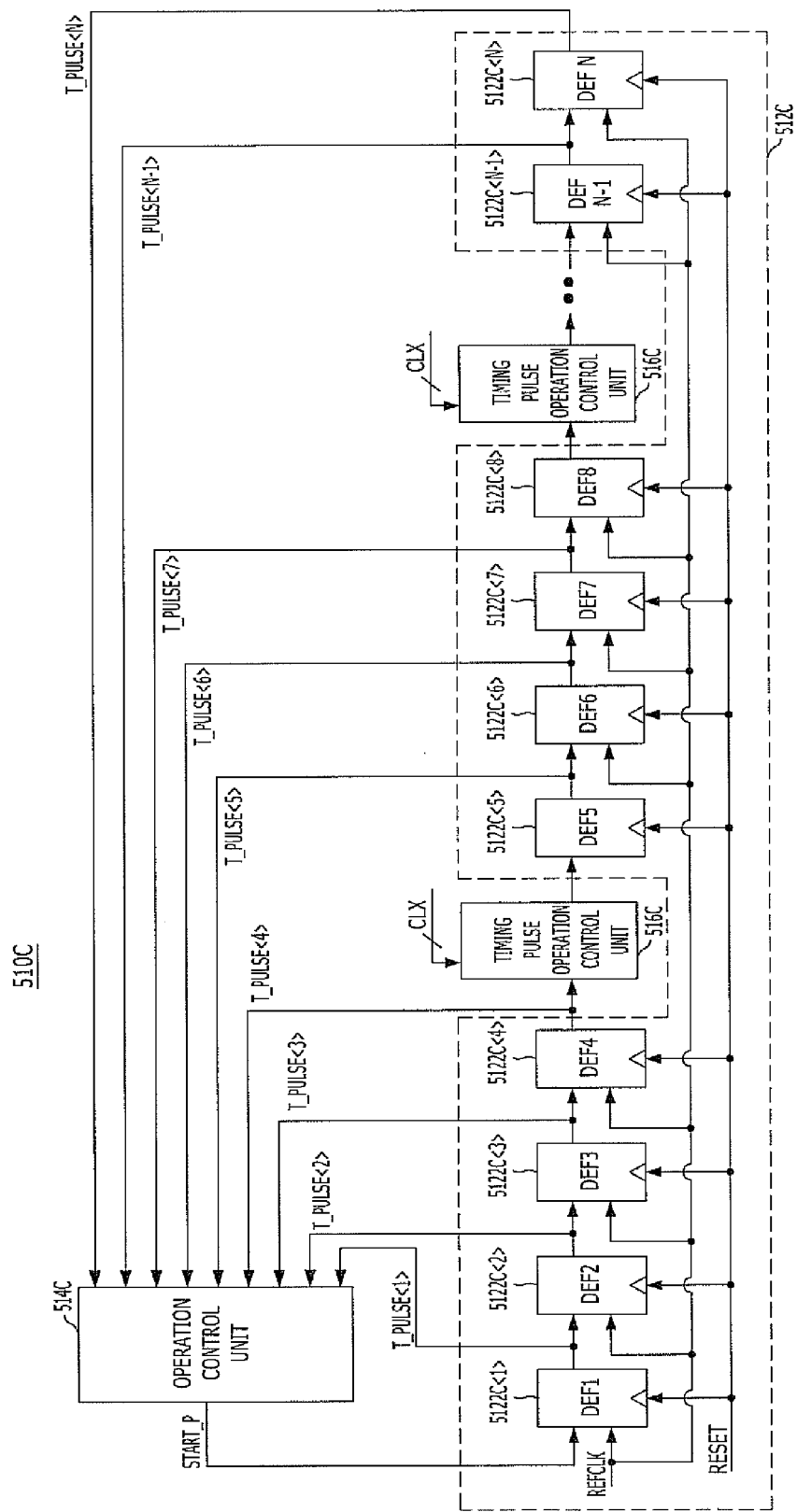
FIG. 6C is a block diagram illustrating a third exemplary embodiment of the timing pulse generating unit of the DLL circuit in accordance with the exemplary embodiment of the present invention illustrated in FIG. 5.

FIG. 6C is a block diagram illustrating a third exemplary embodiment of the timing pulse generating unit of the DLL circuit in accordance with the exemplary embodiment of the present invention illustrated in FIG. 5.

Referring to FIG. 6C, a timing pulse generating unit 510C in accordance with a third exemplary embodiment of the present invention includes: a timing pulse outputting unit 512C configured to sequentially activate/pulse one or more timing pulses (T_PULSE<1:4>, T_PULSE<1:8>, . . . or T_PULSE<1:N-4>) set as a first group among the timing pulses T_PULSE<1:N> in response to the toggling of the source clock REFCLK and sequentially activate/pulse one or more timing pulses (T_PULSE<5:N>, T_PULSE<9:N>, . . . or T_PULSE<N-3:N>) set as a second group among the timing pulses T_PULSE<1:N> in response to the toggling of the source clock REFCLK; an operation control unit 514C configured to repeat the operation of the timing pulse outputting unit 512C; and a timing pulse operation control unit 516C configured to control the on/off of the activation/pulsing of the timing pulses (T_PULSE<5:N>, T_PULSE<9:N>, . . . or T_PULSE<N-3:N>) set as the second group according to the frequency of the source clock REFCLK.

Here, the timing pulse outputting unit 512C includes: first timing pulse outputting units (5122C<1:4>, 5122C <1:8>, . . . or 5122C<1:N-4>) configured to sequentially activate/pulse the timing pulses (T_PULSE<1:4>, T_PULSE<1:8>, . . . or T_PULSE<1:N-4>) set as the first group whenever the source clock REFCLK toggles after the toggling of a timing start pulse START_P; and second timing pulse outputting units (5122C<5:N>, 5122C<9:N>, . . . or 5122C<N-3:N>) configured to sequentially activate/pulse the timing pulses (T_PULSE<5:N>, T_PULSE<9:N>, . . . or T_PULSE<N-3:N>) set as the second group whenever the source clock REFCLK toggles after termination of the operation of the first timing pulse outputting units (respectively 5122C<1:4>, 5122C<1:8>, . . . or 5122C<1:N-4>).

The operation control unit 514C makes the timing start pulse START_P toggle in response to the deactivation of all the timing pulses T_PULSE<1:N>.

The timing pulse toggling operation control unit 516C controls whether or not information about the termination/non-termination of the first timing pulse outputting units (5122C<1:4>, 5122C<1:8>, or 5122C<1:N-4>) is transferred to the second timing pulse outputting units (5122C<5:N>, 5122C<9:N>, . . . or 5122C<N-3:N>) according to the frequency of the source clock REFCLK, thereby turning on/off the activation/pulsing of the timing pulses (T_PULSE<5:N>, T_PULSE<9:N>, . . . or T_PULSE<N-3:N>) set as the second group.

That is, when the frequency of the source clock REFCLK is higher than a reference frequency, the timing pulse toggling operation control unit 516C transfers information about the activation/pulsing of the last pulses (T_PULSE<4>, T_PULSE<8>, . . . or T_PULSE<N-4>) among the timing pulses (T_PULSE<1:4>, T_PULSE<1:8>, . . . or T_PULSE<1:N-4>) set as the first group to the second group in order to sequentially pulse the timing pulses (T_PULSE<5:N>, T_PULSE<9:N>, . . . or T_PULSE<N-3:N>) set as the second group; and when the frequency of the source clock REFCLK is lower than the reference frequency, the timing pulse toggling operation control unit 516C does not transfer information about the activation/pulsing of the last pulses (T_PULSE<4>, T_PULSE<8>, . . . or T_PULSE<N-4>) among the timing pulses (T_PULSE<1:4>, T_PULSE<1:8>, . . . or T_PULSE<1:N-4>) set as the first group to the second group in order to avoid the activation/pulsing of the timing pulses (T_PULSE<5:N>, T_PULSE<9:N>, . . . or T_PULSE<N-3:N>) set as the second group.

For example, when a CAS Latency (CLx) value is larger than a reference value (i.e., 'x' is relatively large), the timing pulse toggling operation control unit 516C transfers information about the activation/pulsing of the last pulses (T_PULSE<4>, T_PULSE<8>, . . . or T_PULSE<N-4>) among the timing pulses (T_PULSE<1:4>, T_PULSE<1:8>, . . . or T_PULSE<1:N-4>) set as the first group to the second group in order to sequentially activate/pulse the timing pulses (T_PULSE<5:N>, T_PULSE<9:N>, . . . or T_PULSE<N-3:N>) set as the second group; and when the CAS Latency (CLx) value is smaller than the reference value (i.e., 'x' is relatively small), the timing pulse toggling operation control unit 516C stops transferring information about the activation/pulsing of the last pulses (T_PULSE<4>, T_PULSE<8>, . . . or T_PULSE<N-4>) among the timing pulses (T_PULSE<1:4>, T_PULSE<1:8>, . . . or T_PULSE<1:N-4>) set as the first group to the second group in order to stop the activation/pulsing of the timing pulses (T_PULSE<5:N>, T_PULSE<9:N>, or T_PULSE<N-3:N>) set as the second group.

For reference, it has been described that the timing pulse generating unit 510C in accordance with the third exemplary embodiment of the present invention may variously select the timing pulses as the first group (T_PULSE<1:4>, T_PULSE<1:8>, . . . or T_PULSE<1:N-4>) and as the second group (T_PULSE<5:N>, T_PULSE<9:N>, . . . or T_PULSE<N-3:N>). The reason for this is that the second group may be variously determined according to which of the timing pulses T_PULSE<1:N> is set as the first group.

For example, when the first to fourth timing pulses T_PULSE<1:4> among the timing pulses T_PULSE<1:N> are set as the first group, the fifth to N$^{th}$ timing pulses T_PULSE<5:N> are set as the second group because the timing pulses beginning with the fifth timing pulse T_PULSE<5> directly following the fourth timing pulse T_PULSE<4> are to be set as the second group.

Likewise, when the first to eighth timing pulses T_PULSE<1:8> among the timing pulses T_PULSE<1:N> are set as the first group, the ninth to N$^{th}$ timing pulses T_PULSE<9:N> are set as the second group because the timing pulses beginning with the ninth timing pulse T_PULSE<9> directly following the eighth timing pulse T_PULSE<8> are to be set as the second group.

It has been described that the number of timing pulses set as the first group among the timing pulses T_PULSE<1:N> increases by four (4→8→12→ . . . →N-4) and the number of timing pulses set as the second group among the timing pulses T_PULSE<1:N> decreases by four (N-4→N-8→N-12→ . . . →4). However, this is merely a feature of exemplary embodiments, and the present invention is not limited thereto. That is, the number of timing pulses set as the first group among the timing pulses T_PULSE<1:N> may increase by less than or more than four and the number of timing pulses set as the second group among the timing pulses T_PULSE<1:N> may decrease by less than or more than four.

That is, the timing pulse among the timing pulses T_PULSE<1:N> that divides the first and second groups may be changed according to the circuit design.

FIG. 7 is a timing diagram illustrating the operation of the timing pulse generating unit in accordance with the first to third exemplary embodiments of the present invention illustrated in FIGS. 6A to 6C.

Referring to FIG. 7, according to the first to third exemplary embodiment of the present invention, it can be seen that the operations of the timing pulse generating units 510A, 510B and 510V are divided into the low frequency operation in which the source clock REFCLK has a relatively low frequency and the high frequency operation in which the source clock REFCLK has a relatively high frequency.

For convenience in description, it is assumed that 'N' in the terms of 'timing pulses T_PULSE<1:N>' is '20'. Also, the DLL operation is simplified for convenience in description. That is, it is assumed that the operation of comparing the phase of the source clock REFCLK with the phases of the feedback clocks FBCLKR and FBCLKF is performed in response to the fourth to sixth timing pulses T_PULSE<4:6> of the timing pulses T_PULSE<0:20>, and the delay shifting operation, which changes the phases of the feedback clocks FBCLKR and FBCLKF, is performed after the predetermined time tDELAY corresponding to the actual delay of the internal clock path from the phase comparing operation.

Regarding the operation of the timing pulse generating units 510A, 510B, and 510C in the case of the source clock REFCLK with a relatively low frequency, because the source clock REFCLK has a low frequency, the delay shifting operation is performed, after the operation of comparing the phase of the source clock FEFCLK with the phases of the feedback clocks FBCLKR and FBCLKF is performed, at around the fourth to sixth timing pulses T_PULSE<4:6> of the timing pulses T_PULSE<0:20>, so that the phases of the feedback clocks FBCLKR and FBCLKF may change while the first to tenth timing pulses T_PULSE<1:10> among the timing pulses T_PULSE<0:20> are sequentially activated/pulsed.

That is, because the source clock REFCLK has a low frequency, the time taken until completion of the delay shifting operation of the DLL circuit is shorter than the time taken to activate/pulse the first to tenth timing pulses T_PULSE<1:10> among the timing pulses T_PULSE<0:20> once sequentially.

Therefore, the timing pulse generating units 510A, 510B, and 510C according to the first to third exemplary embodiments of the present invention do not activate/pulse all the timing pulses T_PULSE<1:20>. That is, the timing pulse generating units 510A, 510B, and 510C may terminate one delay shifting update period after activating/pulsing only the first to tenth timing pulses T_PULSE<1:10> sequentially without activating/pulsing the eleventh to twentieth timing pulses T_PULSE<11:20>.

In this manner, the timing pulse generating units 510A, 510B, and 510C according to the first to third exemplary embodiments of the present invention may vary the number of actually activated/pulsed pulses among the timing pulses T_PULSE<1:20> according to the time taken until completion of the delay shifting operation of the DLL circuit.

Regarding the operation of the timing pulse generating units 510A, 510B, and 510C in the case of the source clock REFCLK with a relatively high frequency, because the source clock REFCLK has a high frequency, the time taken until the phases of the feedback clocks FBCLKR and FBCLKF are changed corresponds to the time taken to sequentially activate/pulse the first to eighteenth timing pulses T_PULSE<1:18> among the timing pulses T_PULSE<0:20>.

That is, because the source clock REFCLK has a high frequency, the time taken until completion of the delay shifting operation of the DLL circuit is shorter than the time taken to activate/pulse the first to eighteenth timing pulses T_PULSE<1:18> among the timing pulses T_PULSE<0:20> once sequentially.

Therefore, the timing pulse generating units 510A, 510B, and 510C according to the first to third exemplary embodiments of the present invention do not activate/pulse all the timing pulses T_PULSE<1:20>. That is, the timing pulse generating units 510A, 510B, and 510C may terminate one delay shifting update period after activating/pulsing only the first to eighteenth timing pulses T_PULSE<1:18> sequentially without activating/pulsing the nineteenth to twentieth timing pulses T_PULSE<19:20>.

In this manner, the timing pulse generating units 510A, 510B, and 510C according to the first to third exemplary embodiments of the present invention may vary the number of actually activated/pulsed pulses among the timing pulses T_PULSE<1:20> according to the time taken until completion of the delay shifting operation of the DLL circuit.

Thus, even when the frequency of the source clock REFCLK is lower or higher than the frequency estimated at the design stage, the DLL operation can be performed with the optimal delay shifting update period. Thus, stable DLL operation can be performed regardless of the frequency of the source clock REFCLK.

As described above, the exemplary embodiments of the present invention change the number of sequentially activated/pulsed pulses among the timing pulses T_PULSE<1:N> according to a change in the frequency of the source clock REFCLK. Accordingly, the DLL circuit controlled in response to the timing pulses T_PULSE<1:N> can perform the optimal DLL operation regardless of a change in the frequency of the source clock REFCLK.

That is, the present invention changes the number of the timing pulses generated according to a change in the frequency of the source clock. Accordingly, the DLL circuit controlled in response to the timing pulses can perform the optimal DLL operation regardless of a change in the frequency of the source clock.

While the present invention has been described with respect to the specific embodiments, it will be apparent to those skilled in the art that various changes and modifications may be made without departing from the spirit and scope of the invention as defined in the following claims.

What is claimed is:

1. A delay locked loop (DLL) circuit comprising:
    a timing pulse generating unit configured to generate a plurality of timing pulses pulsed sequentially for delay shifting update periods in response to a source clock, wherein the number of the generated timing pulses changes according to a change in a frequency of the source clock during an operation of the DLL circuit;
    a clock delay unit configured to compare a phase of the source clock with a phase of a feedback clock at a time point defined by each of the timing pulses, and delay a phase of an internal clock, corresponding to a rising or falling edge of the source clock, according to the comparison result; and
    a delay duplication modeling unit configured to delay an output clock of the clock delay unit by an actual delay of the internal clock path, and to output the delayed clock as the feedback clock.

2. The DLL circuit of claim 1, wherein the timing pulse generating unit comprises:
    a timing pulse outputting unit configured to be initialized in response to an operation control signal and output the timing pulses sequentially in response to the toggling of the source clock, wherein at least two pulses among the timing pulses are set as frequency selection pulses; and
    an operation control signal generating unit configured to select any one of the frequency selection pulses in response to the frequency of the source clock and generate the operation control signal in response to the selected pulse.

3. The DLL circuit of claim 2, wherein the timing pulse outputting unit comprises:
    a reset signal generating unit configured to generate a reset signal in response to the operation control signal; and
    a plurality of timing pulse control units configured to be initialized in response to the reset signal and pulse the timing pulses sequentially in response to the operation control signal and the source clock after the operation initialization.

4. The DLL circuit of claim 2, wherein
    when the frequency of the source clock is high, the operation control signal generating unit selects a pulse pulsed later among the frequency selection pulses; and
    when the frequency of the source clock is low, the operation control signal generating unit selects a pulse pulsed earlier among the frequency selection pulses;
    wherein the operation control signal generating unit activates the operation control signal for a predetermined time in response to the selected pulse.

5. The DLL circuit of claim 2, wherein
    when a column latency strobe (CAS) latency value is relatively large, the operation control signal generating unit selects a pulse pulsed relatively late among the frequency selection pulses; and
    when the CAS latency value is relatively small, the operation control signal generating unit selects a pulse pulsed relatively early among the frequency selection pulses;
    wherein the operation control signal generating unit activates the operation control signal for a predetermined time in response to the selected pulse.

6. The DLL circuit of claim 1, wherein the timing pulse generating unit comprises:
    a timing pulse outputting unit configured to output the timing pulses sequentially in response to the toggling of the source clock;
    an operation control unit configured to repeat an operation of the timing pulse outputting unit; and
    a timing pulse activation control unit configured to deactivate at least one timing pulse among the timing pulses according to the frequency of the source clock.

7. The DLL circuit of claim 6, wherein the timing pulse outputting unit pulses the timing pulses sequentially whenever the source clock toggles after a timing start pulse is toggled.

8. The DLL circuit of claim 7, wherein the operation control unit toggles the timing start pulse in response to the deactivation of all the timing pulses.

9. The DLL circuit of claim 8, wherein the timing pulse activation control unit deactivates a number of the timing pulses sequentially from the last pulse among the timing pulses, wherein the number of deactivated timing pulses depends on the frequency of the source clock.

10. The DLL circuit of claim 9, wherein
when the frequency of the source clock is high, the timing pulse activation control unit reduces the number of deactivated pulses among the timing pulses; and
when the frequency of the source clock is low, the timing pulse activation control unit increases the number of deactivated pulses among the timing pulses.

11. The DLL circuit of claim 9, wherein
when a column latency strobe (CAS) latency value is relatively large, the timing pulse activation control unit deactivates a relatively low number of pulses among the timing pulses; and
when the CAS latency value is relatively small, the timing pulse activation control unit deactivates a relatively high number of pulses among the timing pulses.

12. The DLL circuit of claim 1, wherein the timing pulse generating unit comprises:
a timing pulse outputting unit configured to sequentially pulse one or more timing pulses, which belong to either a first or a second group, among the timing pulses in response to the toggling of the source clock;
an operation control unit configured to repeat an operation of the timing pulse outputting unit; and
a timing pulse operation control unit configured to control the operation of the timing pulse outputting unit to pulse the timing pulses belonging to the second group according to the frequency of the source clock.

13. The DLL circuit of claim 12, wherein the timing pulse outputting unit comprises:
first timing pulse outputting units configured to sequentially pulse the timing pulses belonging to the first group whenever the source clock toggles after a timing start pulse is toggled; and
second timing pulse outputting units configured to sequentially pulse the timing pulses belonging to the second group whenever the source clock toggles after termination of the operation of the first timing pulse outputting units.

14. The DLL circuit of claim 13, wherein the operation control unit toggles the timing start pulse in response to the deactivation of all the timing pulses.

15. The DLL circuit of claim 14, wherein the timing pulse operation control unit controls whether or not information about the termination of the operation of the first timing pulse outputting units is transferred to the second timing pulse outputting units according to the frequency of the source clock, in order to turn on/off the second timing pulse outputting units.

16. The DLL circuit of claim 15, wherein
when the frequency of the source clock is higher than a reference frequency, the timing pulse operation control unit controls the timing pulses, which belong to the second group, to be sequentially pulsed; and
when the frequency of the source clock is lower than the reference frequency, the timing pulse operation control unit controls the timing pulses, which belong to the second group, not to be pulsed.

17. The DLL circuit of claim 15, wherein
when a column latency strobe (CAS) latency value is larger than a reference value, the timing pulse operation control unit controls the timing pulses, which belong to the second group, to be sequentially pulsed; and
when the CAS latency value is smaller than the reference value, the timing pulse operation control unit controls the timing pulses, which belong to the second group, not to be pulsed.

18. An integrated circuit comprising:
a delay locked loop (DLL) circuit configured to output a DLL clock by delaying an internal clock, corresponding to an edge of a source clock, for delay shifting update periods defined by a plurality of timing pulses pulsed sequentially in response to the source clock, in order to lock a delay of the internal clock; and
a timing pulse generating unit configured to generate the timing pulses pulsed sequentially for the delay shifting update periods in response to the source clock, wherein the number of the generated timing pulses changes according to a change in a frequency of the source clock during an operation of the integrated circuit.

19. The integrated circuit of claim 18, wherein the timing pulse generating unit comprises:
a timing pulse outputting unit configured to be initialized in response to an operation control signal and output the timing pulses sequentially in response to the toggling of the source clock, wherein at least two pulses among the timing pulses are set as frequency selection pulses; and
an operation control signal generating unit configured to select any one of the frequency selection pulses in response to the frequency of the source clock and generate the operation control signal in response to the selected pulse.

20. The integrated circuit of claim 19, wherein the timing pulse outputting unit comprises:
a reset signal generating unit configured to generate a reset signal in response to the operation control signal; and
a plurality of timing pulse control units configured to be initialized in response to the reset signal and pulse the timing pulses sequentially in response to the operation control signal and the source clock after the operation initialization.

21. The integrated circuit of claim 18, wherein the timing pulse generating unit comprises:
a timing pulse outputting unit configured to output the timing pulses sequentially in response to the toggling of the source clock;
an operation control unit configured to repeat an operation of the timing pulse outputting unit; and
a timing pulse activation control unit configured to deactivate at least one timing pulse among the timing pulses according to the frequency of the source clock.

22. The integrated circuit of claim 21, wherein the timing pulse activation control unit deactivates a number of the timing pulses sequentially from the last pulse among the timing pulses, wherein the number of deactivated timing pulses depends on the frequency of the source clock.

23. The integrated circuit of claim 18, wherein the timing pulse generating unit comprises:
a timing pulse outputting unit configured to sequentially pulse one or more timing pulses, which belong to either a first or a second group, among the timing pulses in response to the toggling of the source clock;

an operation control unit configured to repeat an operation of the timing pulse outputting unit; and a timing pulse operation control unit configured to control the operation of the timing pulse outputting unit to pulse the timing pulses belonging to the second group according to the frequency of the source clock.

24. The integrated circuit of claim 23, wherein the timing pulse outputting unit comprises:

first timing pulse outputting units configured to sequentially pulse the timing pulses belonging to the first group whenever the source clock toggles after a timing start pulse is toggled; and second timing pulse outputting units configured to sequentially pulse the timing pulses belonging to the second group whenever the source clock toggles after termination of the operation of the first timing pulse outputting units.

25. The integrated circuit of claim 24, wherein the timing pulse operation control unit controls whether or not information about the termination of the operation of the first timing pulse outputting units is transferred to the second timing pulse outputting units according to the frequency of the source clock, in order to turn on/off the second timing pulse outputting units.

26. An integrated circuit comprising:

a clock frequency detecting unit configured to detect a frequency of a source clock; and a timing pulse generating unit configured to generate a plurality of timing pulses sequentially pulsed in response to the source clock, wherein the number of the generated timing pulses changes according to a change in the frequency of the source clock during an operation of the integrated circuit based on a detected result.

27. The integrated circuit of claim 26, wherein internal operations of the integrated circuit are performed according to operation timings defined by the timing pulses.

* * * * *